(12) United States Patent
Karpov et al.

(10) Patent No.: US 9,647,208 B2
(45) Date of Patent: May 9, 2017

(54) LOW VOLTAGE EMBEDDED MEMORY HAVING CONDUCTIVE OXIDE AND ELECTRODE STACKS

(71) Applicants: Elijah V. Karpov, Santa Clara, CA (US); Brian S. Doyle, Portland, OR (US); Charles C. Kuo, Hillsboro, OR (US); Robert S. Chau, Beaverton, OR (US); Eric R. Dickey, Portland, OR (US); Michael Stephen Bowen, Milwaukie, OR (US); Sey-Shing Sun, Portland, OR (US)

(72) Inventors: Elijah V. Karpov, Santa Clara, CA (US); Brian S. Doyle, Portland, OR (US); Charles C. Kuo, Hillsboro, OR (US); Robert S. Chau, Beaverton, OR (US); Eric R. Dickey, Portland, OR (US); Michael Stephen Bowen, Milwaukie, OR (US); Sey-Shing Sun, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/950,784

(22) Filed: Nov. 24, 2015

(65) Prior Publication Data

US 2016/0079523 A1 Mar. 17, 2016

Related U.S. Application Data

(62) Division of application No. 13/630,795, filed on Sep. 28, 2012, now Pat. No. 9,231,204.

(51) Int. Cl.
*G11C 11/00* (2006.01)
*H01L 45/00* (2006.01)
(Continued)

(52) U.S. Cl.
CPC .......... *H01L 45/08* (2013.01); *G11C 13/0007* (2013.01); *G11C 13/0069* (2013.01);
(Continued)

(58) Field of Classification Search
CPC .......................... G11C 11/00; G11C 13/0007
(Continued)

(56) References Cited

U.S. PATENT DOCUMENTS

| 6,682,969 B1 * | 1/2004 | Basceri et al. ............ 438/240 |
| 7,023,043 B2 * | 4/2006 | Basceri et al. ............ 257/306 |

(Continued)

FOREIGN PATENT DOCUMENTS

| JP | 2005123574 | 5/2005 |
| KR | 20060083368 | 7/2006 |
| KR | 20080000357 | 1/2008 |

OTHER PUBLICATIONS

Graham, et al. "Experimental study of the Ioffe-Regel criterion for amorphous indium oxide films," J. Phys.: Condens. Matter 10 (1998), pp. 809-819.

(Continued)

*Primary Examiner* — Harry W Byrne
(74) *Attorney, Agent, or Firm* — Blakely, Sokoloff, Taylor & Zafman LLP

(57) ABSTRACT

Low voltage embedded memory having conductive oxide and electrode stacks is described. For example, a material layer stack for a memory element includes a first conductive electrode. A conductive oxide layer is disposed on the first conductive electrode. The conductive oxide layer has a plurality of oxygen vacancies therein. A second electrode is disposed on the conductive oxide layer.

10 Claims, 7 Drawing Sheets

(51) Int. Cl.
  *G11C 13/00* (2006.01)
  *H01L 27/24* (2006.01)
(52) U.S. Cl.
  CPC .......... *H01L 27/2436* (2013.01); *H01L 45/04* (2013.01); *H01L 45/1233* (2013.01); *H01L 45/146* (2013.01); *H01L 45/147* (2013.01); *G11C 2013/0073* (2013.01)
(58) Field of Classification Search
  USPC ...... 365/49.13, 65, 109, 117, 145, 148, 158; 257/295, E21.208, E21.663, E21.664, 257/E27.104, E29.164; 438/3
  See application file for complete search history.

(56) References Cited

U.S. PATENT DOCUMENTS

| | | | |
|---|---|---|---|
| 8,362,457 B2* | 1/2013 | Kim et al. | 257/4 |
| 2002/0084480 A1* | 7/2002 | Basceri et al. | 257/306 |
| 2004/0245557 A1 | 12/2004 | Seo et al. | |
| 2007/0069270 A1* | 3/2007 | Basceri et al. | 257/306 |
| 2011/0248236 A1* | 10/2011 | Kim et al. | 257/4 |
| 2012/0112153 A1 | 5/2012 | Ninomiya et al. | |

OTHER PUBLICATIONS

International Search Report and Wirtten Opinion for PCT Patent Application No. PCT/US2013/045034, mailed Nov. 18, 2013, 12 pages.
Office Action for Taiwanese Patent Application No. 102133673, mailed Mar. 17, 2015, 13 pgs.
Office Action from Taiwan Patent Application No. 102133673 mailed Sep. 22, 2015, 2 pgs.
International Preliminary Report on Patentability for PCT Patent Application No. PCT/US2013/045034, mailed Apr. 9, 2015, 8 pages.
Non-Final Office Action from U.S. Appl. No. 14/950,784 mailed Apr. 14, 2015, 9 pgs.

* cited by examiner

LOW VOLTAGE EMBEDDED MEMORY HAVING CONDUCTIVE OXIDE AND ELECTRODE STACKS

CROSS-REFERENCE TO RELATED APPLICATIONS

This application is a divisional of U.S. patent application Ser. No. 13/630,795, filed on Sep. 28, 2012, the entire contents of which are hereby incorporated by reference herein.

TECHNICAL FIELD

Embodiments of the invention are in the field of memory devices and, in particular, low voltage embedded memory having conductive oxide and electrode stacks.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Embedded SRAM and DRAM have problems with non-volatility and soft error rates, while embedded FLASH memories require additional masking layers or processing steps during manufacture, require high-voltage for programming, and have issues with endurance and reliability. Non-volatile memory based on resistance change, known as RRAM/ReRAM, typically operates at voltages greater than 1V, typically requires a high voltage (>1V) forming step to form a filament, and typically have high resistance values limiting read performance. For low voltage non-volatile embedded applications, operating voltages less than 1V and compatible with CMOS logic processes may be desirable.

Thus, significant improvements are still needed in the area of nonvolatile device manufacture and operation.

DESCRIPTION OF THE EMBODIMENTS

Low voltage embedded memory having conductive oxide and electrode stacks is described. In the following description, numerous specific details are set forth, such as specific conductive oxide material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of described herein are directed to structures for and approaches to using low voltage embedded memory. The memory is based on conductive oxide and electrode stacks. Applications of such memory may include, but are not limited to, back end memory, embedded memory, resistive memory, RRAM. In one or more embodiments, the structural architecture of the memory is based on a junction-free arrangement, in that a non-conducting layer is not used in the functional element of the memory stack.

More specifically, in an embodiment, a metal-conductive oxide-metal (MCOM) structure is implemented to fabricate a resistance change memory (often referred as RRAM) based architecture, e.g., instead of a metal-dielectric (insulating) oxide-metal (MIM) based structure. The latter type is conventionally used for state of the art RRAM devices. For example, a conventional RRAM device may be based on a metal-$HfO_x$-metal structure.

Figure 1:
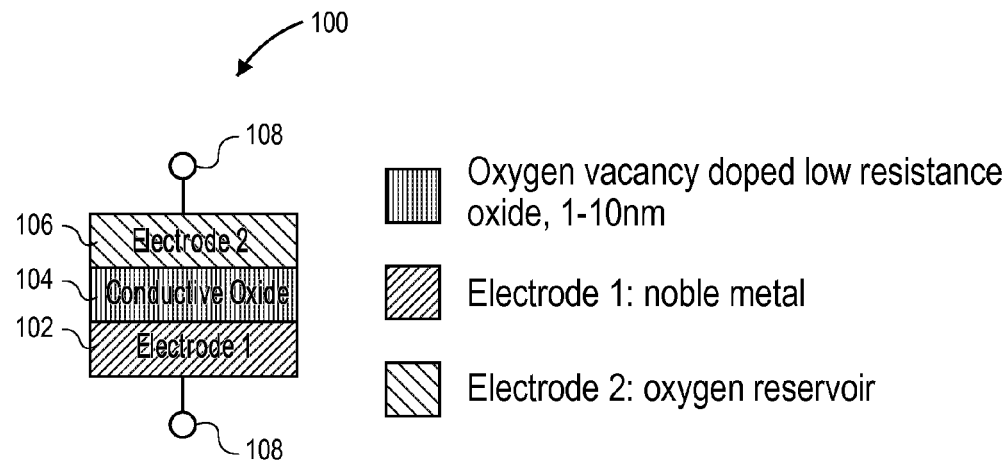
FIG. 1 illustrates a metal-conductive oxide-metal (MCOM) memory element, in accordance with an embodiment of the present invention.

To illustrate concepts described herein, FIG. 1 illustrates a metal-conductive oxide-metal (MCOM) memory element, in accordance with an embodiment of the present invention. Referring to FIG. 1, a memory element 100 includes a first electrode 102, a conductive oxide layer 104, and a second electrode 106. The memory element 100 may be included in a memory architecture via nodes 108. For example, such a device may be placed between a bitline and a selector element such as a 1T (MOS transistor), or 2-terminal thin film selector which is connected to a wordline. In a particular embodiment, as indicated by the reference scheme in FIG. 1 to the right of memory element 100, the conductive oxide layer 104 is an oxygen vacancy doped low resistance oxide having a thickness approximately in the range of 1-10 nanometers, the first electrode 102 is composed of a noble metal, and the second electrode 106 is an oxygen reservoir, as will be described in greater detail below.

Figure 2:
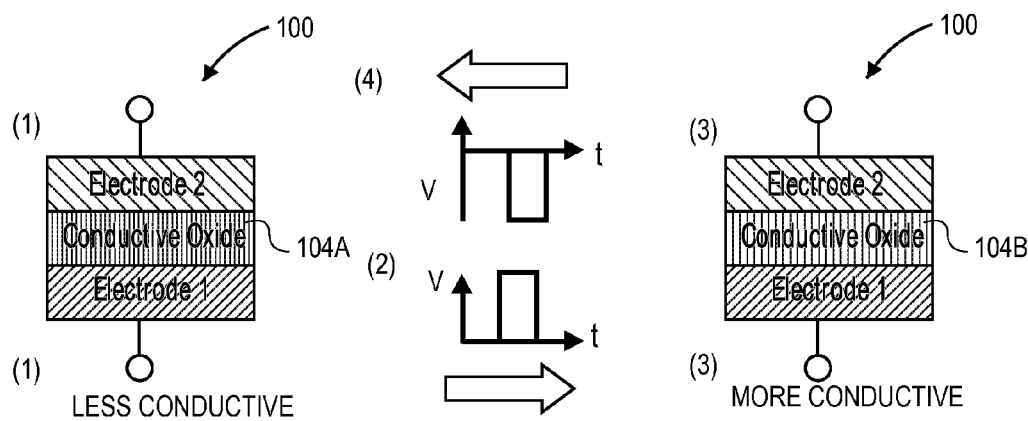
FIG. 2 illustrates an operational schematic representing a changing of states for the memory element of FIG. 1, in accordance with an embodiment of the present invention.

FIG. 2 illustrates an operational schematic representing a changing of states for the memory element of FIG. 1, in accordance with an embodiment of the present invention. Referring to FIG. 2, memory element 100 may begin in a less conductive state (1), with conductive oxide layer 104 being in a less conductive state 104A. An electrical pulse, such as a duration of a positive bias (2) may be applied to provide memory element 100 in a more conductive state (3), with conductive oxide layer 104 being in a more conductive state 104B. An electrical pulse, such as a duration of a negative bias (4) may be applied to again provide memory element 100 having the less conductive state (1). Thus, electrical pulsing may be used to change resistance of the memory element 100.

Thus, in an embodiment, a memory element includes a conductive oxide layer sandwiched between two electrodes. Resistivity of the conductive oxide layer in low field (when device is read) is, in some embodiments, in the range found typical of conductive films of metal compounds, e.g. TiAlN. For example, in a specific embodiment, the resistivity for such a layer is approximately in the range of 0.1 Ohm cm-10 kOhm cm when measured at low field. Resistivity of the film is tuned depending in the memory element size to achieve final resistance value in the range compatible with fast read. Resistivity of the conductive oxide layer in high field (when device is written to) is, in some embodiments, in the range found typical of conductive films of metals, like Ti, as conduction in this regime has both high electronic and ionic current components. For example, in a specific embodiment, the resistivity for such a layer is approximately in the range of 10 u Ohm cm-1 mOhm cm in high field. Composition of the conductive oxide layer may be tuned in such a way that a small change in its composition results in a large change in resistance. Resistance change occurs, in some embodiments, due to a Mott transition. An example is $In_2O_{3-x}$, described by M. R. Graham, Cavendish Lab, UK, in J. Phys.: Condens. Matter 10 (1998) p. 809. In other embodiments, the resistance change can be induced by changing the concentration of oxygen vacancies in the conductive oxide layer.

Figure 3:
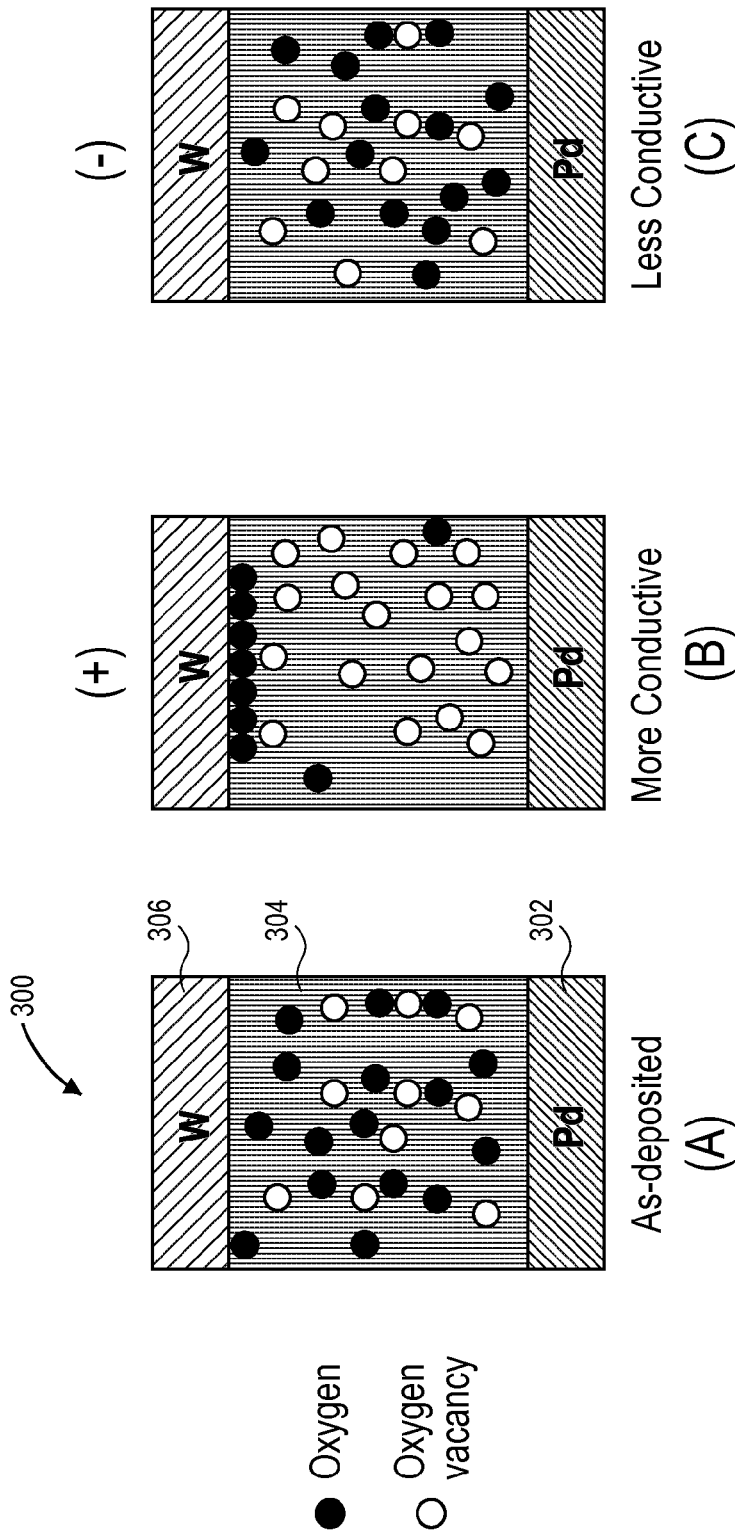
FIG. 3 illustrates a schematic representation of resistance change in a conductive oxide layer induced by changing the concentration of oxygen vacancies in the conductive oxide layer, in accordance with an embodiment of the present invention.

As an example of the later approach, FIG. 3 illustrates a schematic representation of resistance change in a conductive oxide layer induced by changing the concentration of oxygen vacancies in the conductive oxide layer, in accordance with an embodiment of the present invention. Referring to FIG. 3, a memory element 300 is shown as deposited (A). The memory element includes a conductive oxide layer 304 between a palladium (Pd) electrode 302 and a tungsten (W) electrode 306. Oxygen atoms and oxygen vacancies may be distributed as shown in (A). Referring to (B) of FIG. 3, upon application of a positive bias, the memory element 300 can be made more conductive. In that state, oxygen atoms migrate to the electrode 306, while vacancies remain throughout the layer 304. Referring to (C) of FIG. 3, upon application of a negative bias, the memory element can be made less conductive. That that state, oxygen atoms are distributed more evenly throughout layer 304. Accordingly, in an embodiment, effective composition (e.g., the location of oxygen atoms versus vacancies) of a conductive oxide layer is modified to change resistance of a memory element. In a specific embodiment, an applied electrical field, which drives such compositional change, is tuned to values approximately in the range of 1e6-1e7 V/cm.

As mentioned briefly above, in an embodiment, one electrode in a memory element including a conductive oxide layer is a noble metal based electrode, while the other electrode in is a transition metal for which some of the lower valence oxides are conductive (e.g., to act as an oxygen reservoir). That is, when oxygen atoms migrate to the transition metal oxide, the resulting interfacial transition metal oxide formed remains conductive. Examples of suitable transition metals which form conductive oxides include but are not limited to, W, V, Cr, or Ir. In other embodiments, one or both of the electrodes is fabricated from an electrochromic material. In other embodiments, one or both of the electrodes is fabricated from a second, different conductive oxide material. In an embodiment, examples of suitable conductive oxides include, but are not limited to: ITO $(In_2O_{3-x}SnO_{2-x})$, $In_2O_{3-x}$, sub-stoichiometric yttria doped zirconia $(Y_2O_{3-x}ZrO_{2-x})$, or $La_{1-x}Sr_xGa_{1-y}Mg_yO_{3-x-0.5(x+y)}$. In another embodiment, the conductive oxide layer is composed of a material with two or more metal elements (e.g., as contrasted to common RRAM memories using one metal such as found in binary oxides, such as $HfO_x$ or $TaO_x$). In such ternary, quaternary, etc. alloys, the metals used are from adjacent columns of the periodic table. Specific examples of suitable such conductive oxides include, but are not limited to: Y and Zr in $Y_2O_{3-x}ZrO_{2-x}$, In and Sn in $In_2O_{3-x}SnO_{2-x}$, or Sr and La in $La_{1-x}Sr_xGa_{1-y}Mg_yO_3$. Such materials may be viewed as compositions selected to have aliovalent substitution to significantly increase the number of oxygen vacancies. Note, that in some embodiments the change of resistance of such electrode during programming can contribute to the total resistance change.

In an embodiment, examples of suitable noble metals include, but are not limited to Pd or Pt. In a specific embodiment, a more complex, yet still all-conductive, stack includes an approximately 10 nm Pd first electrode layer, an approximately 3 nm $In_2O_{3-x}$ and/or $SnO_{2-x}$ conductive oxide layer, and a second electrode stack composed of approximately 20 nm tungsten/10 nm Pd/100 nm TiN/55 nm W.

One of the differences of one or more embodiments described herein with respect to state of the art resistive devices is that all layers in the stack of the memory element are composed of conducting thin films. As a result, the device structure for the resulting resistive memory element is different from the state of the art devices where at least one of the films is an insulator and/or dielectric film. For such films in the conventional devices, the resistivity is many orders of magnitude higher than that of metals or metal compounds and is essentially non measurable at low field until the device is formed. However, in embodiments described herein, since all layers in the memory element are conductors, the arrangement enables one or more of the following: (1) low voltage operation, e.g., less than 1 Volt operation; (2) elimination of the need for a one time high voltage, commonly called forming voltage, required for state of the art RRAM; and (3) low resistances (e.g., since all components are conductors) which can provide for fast read in operation of a memory device having the MCOM structure.

In an embodiment, a memory element including a conductive oxide layer is fabricated by a process flow including a capacitor flow for which all active layers are deposited in situ to eliminate contamination related effects. Memory operation can be performed at voltages at or below DC 1V. In one embodiment, the fabricated device does not require application of initial high voltage DC sweep, e.g., as is known as first fire for conventional devices.

Figure 4:
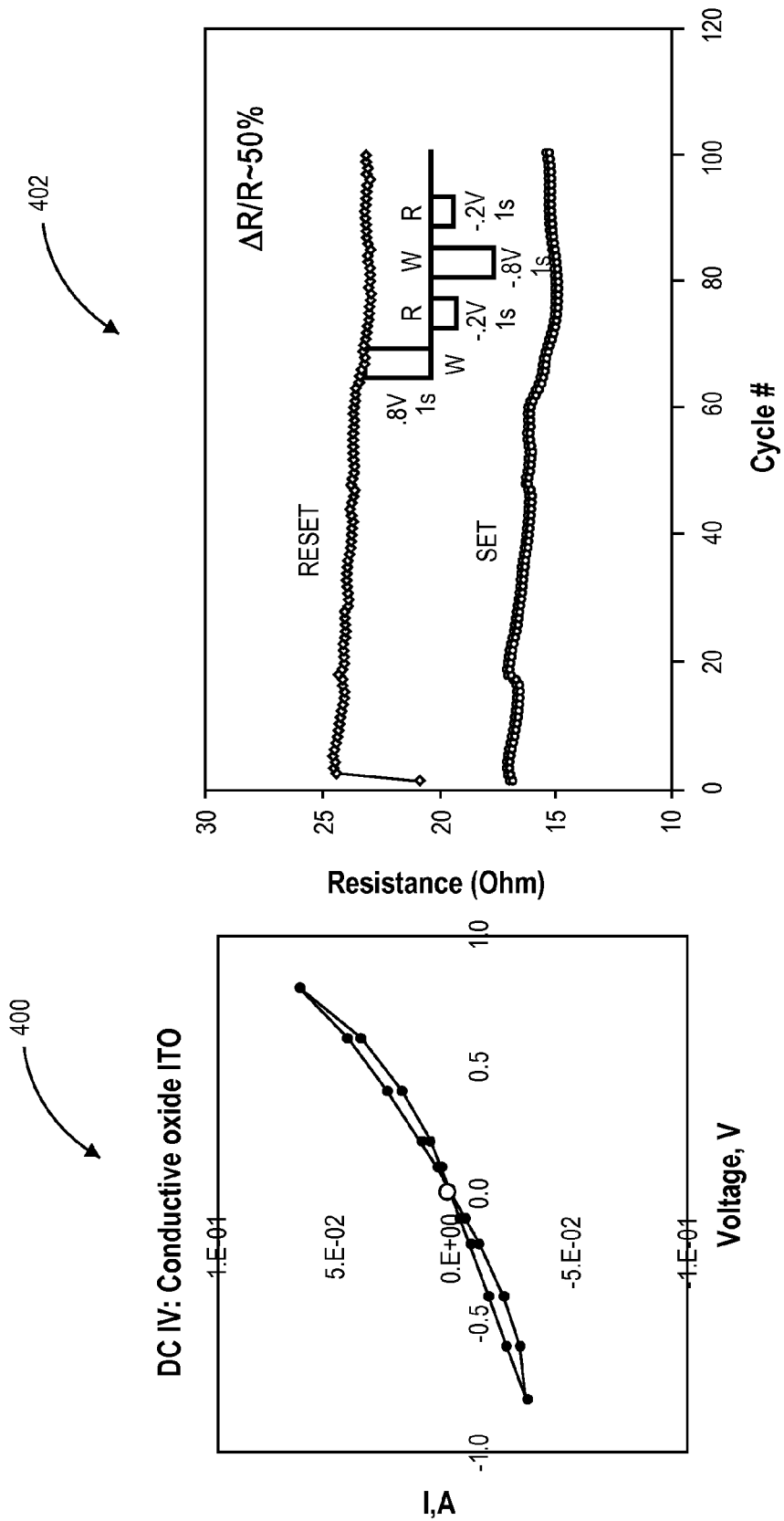
FIG. 4 includes a plot of current as a function of voltage and a plot of resistance as a function of cycle # for the operation of a memory device based on an indium tin oxide ($In_2O_{3-x}SnO_{2-x}$) conductive oxide layer, in accordance with an embodiment of the present invention.
Figure 5:
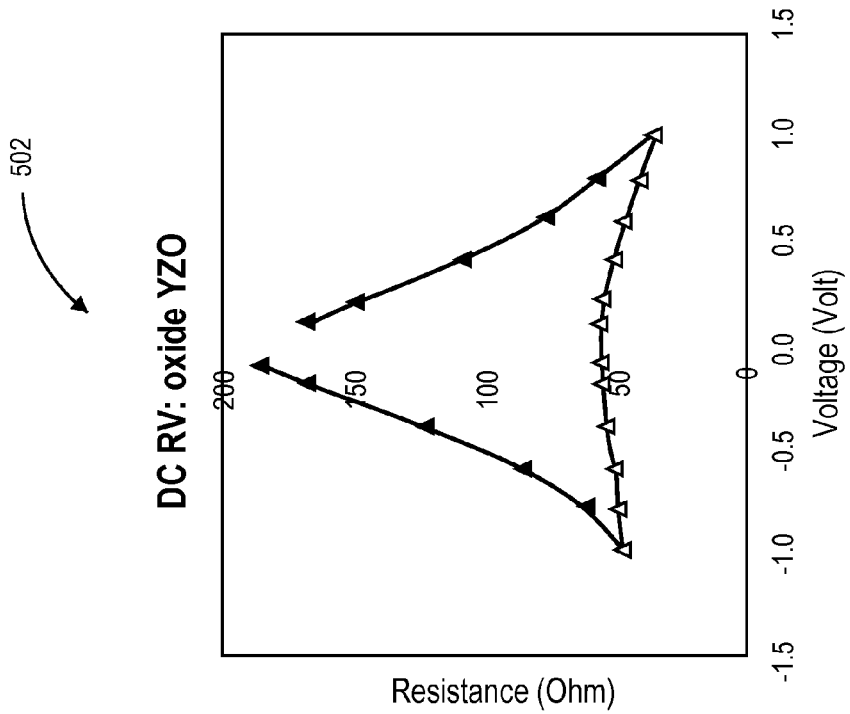
FIG. 5 includes a plot of current as a function of voltage and a plot of resistance as a function of cycle # for the operation of a memory device based on a sub-stoichiometric yttria doped zirconia ($Y_2O_{3-x}ZrO_{2-x}$, YZO) conductive oxide layer, in accordance with an embodiment of the present invention.
Figure 5:
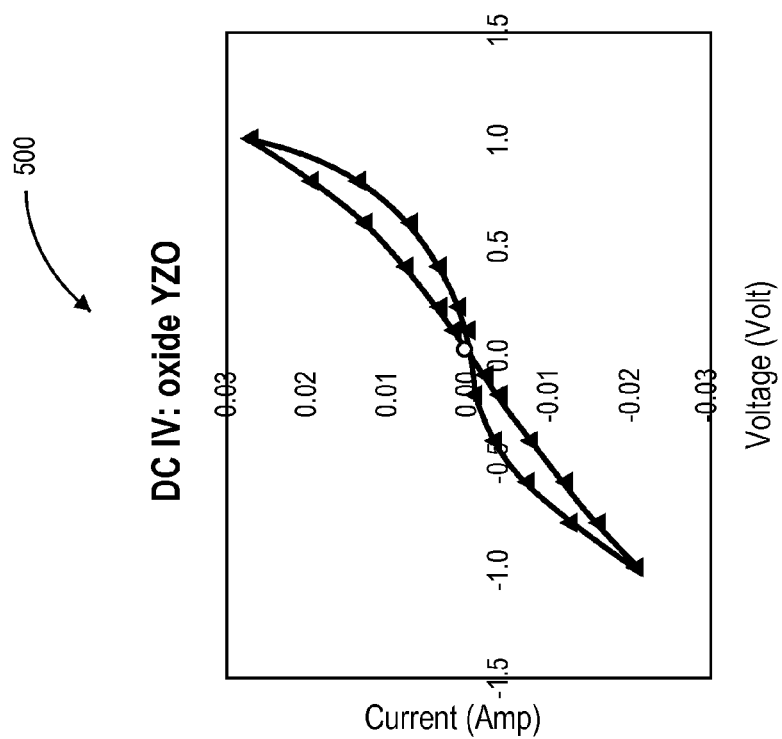
Figure 6:
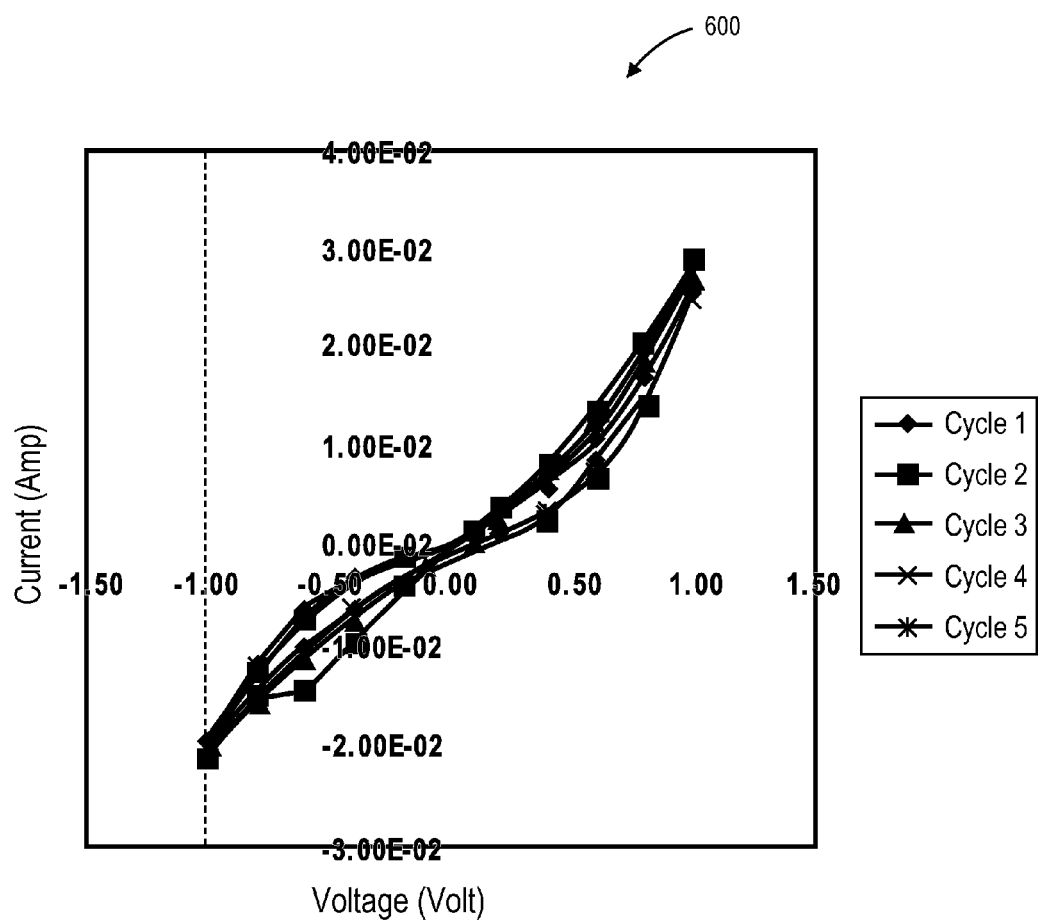
FIG. 6 includes a plot showing multiple DC IV cycles for a conductive sub-stoichiometric yttria doped zirconia, $Y_2O_{3-x}ZrO_{2-x}$, based device, e.g., as a Pd/YZO/W stack, in accordance with an embodiment of the present invention.

In a first example, FIG. 4 includes a plot 400 of current as a function of voltage and a plot 402 of resistance as a function of cycle # for the operation of a memory device based on an indium tin oxide $(In_2O_{3-x}SnO_{2-x})$ conductive oxide layer, in accordance with an embodiment of the present invention. The plots 400 and 402 specifically represent characteristics of a conductive oxide random access memory (CORAM) device based on a Pd/ITO/W stack. In a second example, FIG. 5 includes a plot 500 of current as a function of voltage and a plot 502 of resistance as a function of cycle # for the operation of a memory device based on a sub-stoichiometric yttria doped zirconia ($Y_2O_{3-x}ZrO_{2-x}$, YZO) conductive oxide layer, in accordance with an embodiment of the present invention. The plots 500 and 502 specifically represent characteristics of a CORAM device based on a Pd/YZO/W stack. In one embodiment, for fabrication, the electrodes of the above two devices are formed via in situ deposition. Referring to FIG. 6, multiple DC IV cycles are shown in plot 600 for conductive sub-stoichiometric yttria doped zirconia, $Y_2O_{3-x}ZrO_{2-x}$, based device, e.g., as a Pd/YZO/W stack, in accordance with an embodiment of the present invention. Referring to plot 600, the data demonstrates repeatable hysteretic behavior indicative of reproducible two resistance states.

Referring again to the description associated with FIGS. 1-6 above, a stack of conductive layers including a conductive metal oxide layer may be used to fabricate as memory bit cell. For example, FIG. 7 illustrates a schematic of a memory bit cell 700 which includes a metal-conductive oxide-metal (MCOM) memory element 710, in accordance with an embodiment of the present invention.

Figure 7:
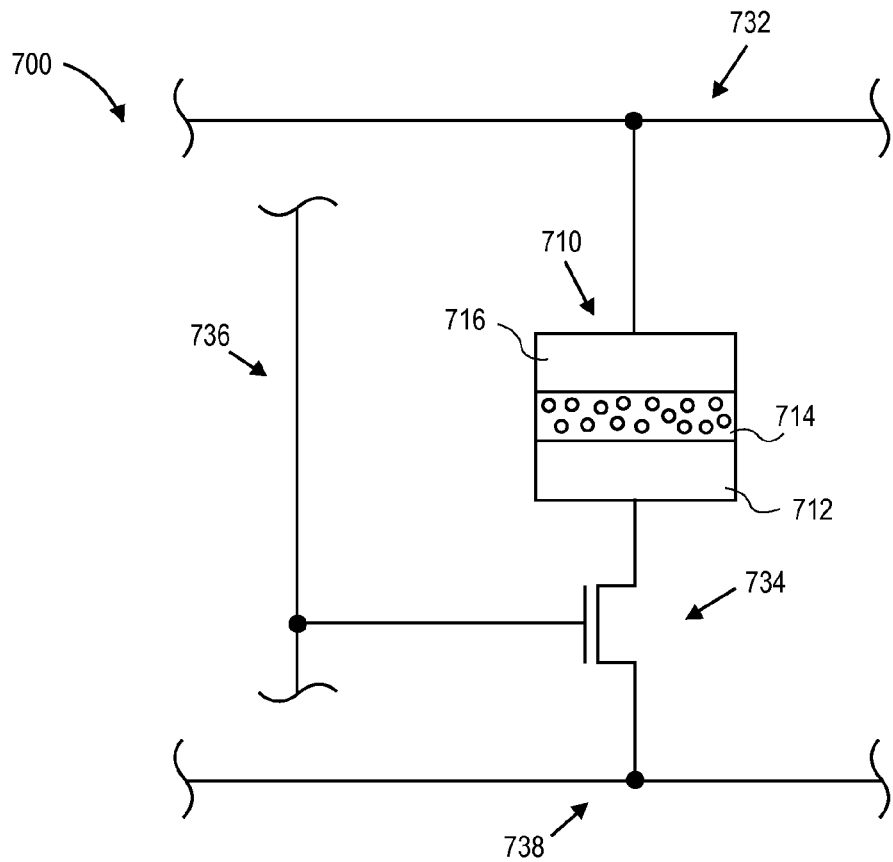
FIG. 7 illustrates a schematic of a memory bit cell which includes a metal-conductive oxide-metal (MCOM) memory element, in accordance with an embodiment of the present invention.

Referring to FIG. 7, the MCOM memory element 710 may include a first conductive electrode 712 with a conductive metal oxide layer 714 adjacent the first conductive electrode 712. A second conductive electrode 716 is adjacent the conductive metal oxide layer 714. The second conductive electrode 716 may be electrically connected to a bit line 732. The first conductive electrode 712 may be coupled with a transistor 734. The transistor 734 may be coupled with a word line 736 and a source line 738 in a manner that will be understood to those skilled in the art. The memory bit cell 700 may further include additional read and write circuitry (not shown), a sense amplifier (not shown), a bit line reference (not shown), and the like, as will be understood by those skilled in the art, for the operation of the memory bit cell 700. It is to be understood that a plurality of the memory bit cells 700 may be operably connected to one another to form a memory array (not shown), wherein the memory array can be incorporated into a non-volatile memory device. It is to be understood that the transistor 734 may be connected to the second conductive electrode 716 or the first conductive electrode 712, although only the latter is shown.

Figure 8:
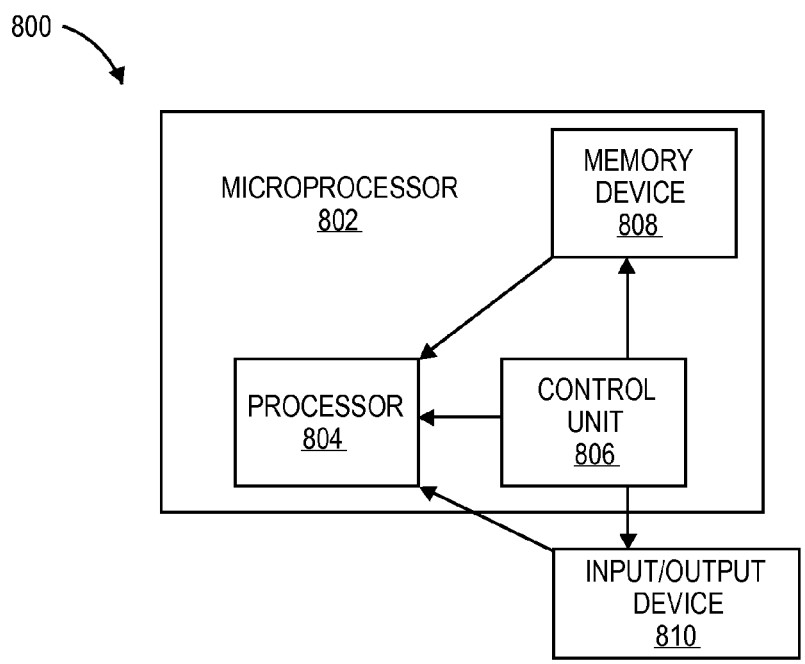
FIG. 8 illustrates a block diagram of an electronic system, in accordance with an embodiment of the present invention.

FIG. 8 illustrates a block diagram of an electronic system 800, in accordance with an embodiment of the present invention. The electronic system 800 can correspond to, for example, a portable system, a computer system, a process control system, or any other system that utilizes a processor and an associated memory. The electronic system 800 may include a microprocessor 802 (having a processor 804 and control unit 806), a memory device 808, and an input/output device 810 (it is to be understood that the electronic system 800 may have a plurality of processors, control units, memory device units and/or input/output devices in various embodiments). In one embodiment, the electronic system 800 has a set of instructions that define operations which are to be performed on data by the processor 804, as well as, other transactions between the processor 804, the memory device 808, and the input/output device 810. The control unit 806 coordinates the operations of the processor 804, the memory device 808 and the input/output device 810 by cycling through a set of operations that cause instructions to be retrieved from the memory device 808 and executed. The memory device 808 can include a memory element having a conductive oxide and electrode stack as described in the present description. In an embodiment, the memory device 808 is embedded in the microprocessor 802, as depicted in FIG. 8.

Figure 9:
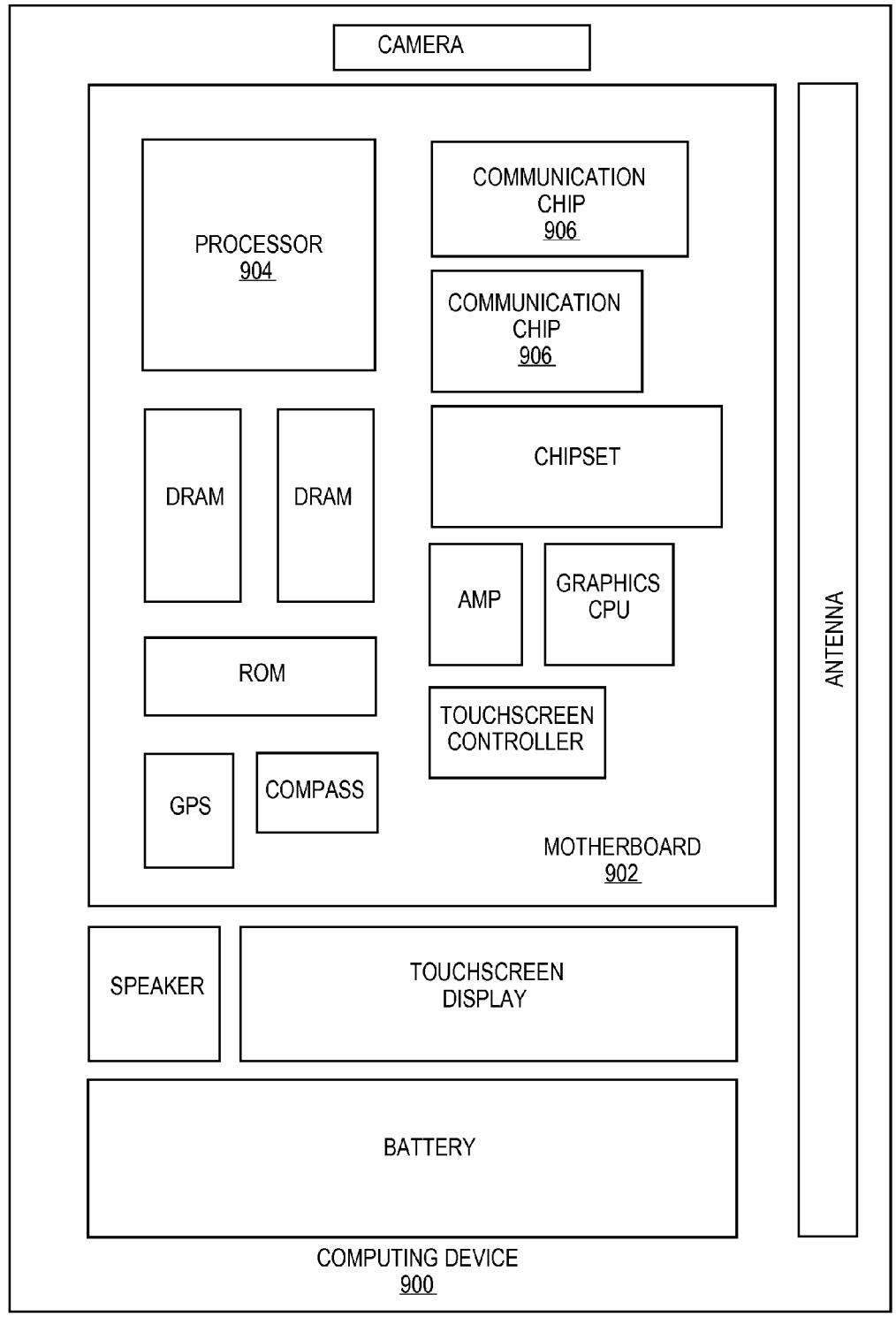
FIG. 9 illustrates a computing device in accordance with one implementation of the invention.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor includes, or is electrically coupled with, one or more devices low voltage embedded memory having conductive oxide and electrode stacks in accordance with implementations of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip includes, or is electrically coupled with, one or more devices low voltage embedded memory having conductive oxide and electrode stacks in accordance with implementations of the invention.

In further implementations, another component housed within the computing device 900 may contain an integrated circuit die that includes, or is electrically coupled with, one or more devices low voltage embedded memory having conductive oxide and electrode stacks in accordance with implementations of the invention.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Accordingly, one or more embodiments of the present invention relate generally to the fabrication of microelectronic memory. The microelectronic memory may be non-volatile, wherein the memory can retain stored information even when not powered. One or more embodiments of the present invention relate to the fabrication of a memory element having a conductive oxide and electrode stack for non-volatile microelectronic memory devices. Such an element may be used in an embedded non-volatile memory, either for its non-volatility, or as a replacement for embedded dynamic random access memory (eDRAM). For example, such an element may be used for, or in place of, 1T-1X memory (X=capacitor or resistor) at competitive cell sizes within a given technology node.

Thus, embodiments of the present invention include low voltage embedded memory having conductive oxide and electrode stacks.

In an embodiment, a material layer stack for a memory element includes a first conductive electrode. A conductive oxide layer is disposed on the first conductive electrode. The conductive oxide layer has a plurality of oxygen vacancies therein. A second electrode is disposed on the conductive oxide layer.

In one embodiment, the conductive oxide layer is an oxygen vacancy doped low resistance oxide layer having a thickness approximately in the range of 1-10 nanometers.

In one embodiment, the conductive oxide layer is composed of a material such as, but not limited to, ITO ($In_2O_{3-x}SnO_{2-x}$), $In_2O_{3-x}$, sub-stoichiometric yttria doped zirconia ($Y_2O_{3-x}ZrO_{2-x}$), and $La_{1-x}Sr_xGa_{1-y}Mg_yO_{3-X-0.5(x+y)}$.

In one embodiment, the resistivity of the conductive oxide layer is approximately in the range of 10 mOhm cm-10 kOhm when measured at a low field of approximately 0.1V.

In one embodiment, the first electrode is a noble metal electrode.

In one embodiment, the noble metal electrode is composed of a material such as, but not limited to, palladium (Pd) or platinum (Pt).

In one embodiment, the second electrode is composed of a transition metal having a corresponding conductive lower valence oxide.

In one embodiment, the second electrode provides an oxygen reservoir.

In one embodiment, the transition metal is one such as, but not limited to, tungsten (W), vanadium (V), chromium (Cr), or iridium (Ir).

In an embodiment, a non-volatile memory device includes a first conductive electrode. A conductive oxide layer is disposed on the first conductive electrode. A second electrode is disposed on the conductive oxide layer. A transistor is electrically connected to the first or the second electrode, a source line, and a word line. A bit line is electrically coupled with the other of the first or the second electrode.

In one embodiment, the conductive oxide layer has a plurality of oxygen vacancies therein.

In one embodiment, the conductive oxide layer is an oxygen vacancy doped low resistance oxide layer having a thickness approximately in the range of 1-10 nanometers.

In one embodiment, the conductive oxide layer is composed of a material such as, but not limited to, ITO ($In_2O_{3-x}SnO_{2-x}$), $In_2O_{3-x}$, sub-stoichiometric yttria doped zirconia ($Y_2O_{3-x}ZrO_{2-x}$), and $La_{1-x}Sr_xGa_{1-y}Mg_yO_{3-X-0.5(x+y)}$.

In one embodiment, the conductive oxide layer comprises an oxide material including two metals from adjacent columns of the Periodic Table.

In one embodiment, the resistivity of the conductive oxide layer is approximately in the range of 10 mOhm cm-10 kOhm when measured at a low field of approximately 0.1V.

In one embodiment, the first electrode is a noble metal electrode.

In one embodiment, the noble metal electrode is composed of a material such as, but not limited to, palladium (Pd) or platinum (Pt).

In one embodiment, the second electrode is composed of a transition metal having a corresponding conductive lower valence oxide.

In one embodiment, the second electrode provides an oxygen reservoir.

In one embodiment, the transition metal is one such as, but not limited to, tungsten (W), vanadium (V), chromium (Cr), or iridium (Ir).

In an embodiment, a method of operating a non-volatile memory device includes applying a positive bias to a memory element. The memory element includes a first conductive electrode, a conductive oxide layer disposed on the first conductive electrode, and a second electrode disposed on the conductive oxide layer. The method also includes changing the conductive oxide layer from a less conductive state to a more conductive state by the applying.

In one embodiment, the conductive oxide layer includes oxygen atoms and oxygen vacancies, and changing the conductive oxide layer from the less conductive state to the more conductive state includes migrating the oxygen atoms from the bulk of the conductive oxide layer toward one of the electrodes.

In one embodiment, changing the conductive oxide layer from the less conductive state to the more conductive state includes causing a change in composition of the conductive oxide layer.

In one embodiment, a resistance change is induced by changing the concentration of oxygen vacancies in the conductive oxide layer.

In one embodiment, changing the conductive oxide layer from the less conductive state to the more conductive state includes inducing a Mott transition.

In one embodiment, applying the positive bias includes applying a bias of less than 1V.

In an embodiment, a method of operating a non-volatile memory device includes applying a negative bias to a memory element. The memory element includes a first conductive electrode, a conductive oxide layer disposed on the first conductive electrode, and a second electrode disposed on the conductive oxide layer. The method also includes changing the conductive oxide layer from a more conductive state to a less conductive state by the applying.

In one embodiment, the conductive oxide layer includes oxygen atoms and oxygen vacancies, and changing the conductive oxide layer from the more conductive state to the less conductive state includes migrating the oxygen atoms from one of the electrodes toward the bulk of the conductive oxide layer.

In one embodiment, changing the conductive oxide layer from the more conductive state to the less conductive state includes causing a change in composition of the conductive oxide layer.

In one embodiment, a resistance change is induced by changing the concentration of oxygen vacancies in the conductive oxide layer.

In one embodiment, changing the conductive oxide layer from the more conductive state to the less conductive state includes inducing a Mott transition.

What is claimed is:

1. A non-volatile memory device, comprising:
   a first conductive electrode;
   a conductive oxide layer disposed on the first conductive electrode; and
   a second electrode disposed on the conductive oxide layer;
   a transistor electrically connected to the first or the second electrode, a source line, and a word line; and
   a bit line electrically coupled with the other of the first or the second electrode; and wherein the conductive oxide layer has a plurality of oxygen vacancies therein.

2. The non-volatile memory device of claim 1, wherein the conductive oxide layer is an oxygen vacancy doped low resistance oxide layer having a thickness approximately in the range of 1-10 nanometers.

3. The non-volatile memory device of claim 1, wherein the conductive oxide layer comprises a material selected from the group consisting of ITO ($In_2O_{3-x}SnO_{2-x}$), $In_2O_{3-x}$, sub-stoichiometric yttria doped zirconia ($Y_2O_{3-x}ZrO_{2-x}$), and $La_{1-x}Sr_xGa_{1-y}Mg_yO_{3-X-0.5(x+y)}$.

4. The non-volatile memory device of claim 1, wherein the conductive oxide layer comprises an oxide material including two metals from adjacent columns of the Periodic Table.

5. The non-volatile memory device of claim 1, wherein the resistivity of the conductive oxide layer is approximately in the range of 10 mOhm cm-10 kOhm when measured at a low field of approximately 0.1V.

6. The non-volatile memory device of claim 1, wherein the first electrode is a noble metal electrode.

7. The non-volatile memory device of claim 6, wherein the noble metal electrode comprises a material selected from the group consisting of palladium (Pd) and platinum (Pt).

8. The non-volatile memory device of claim 1, wherein the second electrode comprises a transition metal having a conductive lower valence oxide.

9. The non-volatile memory device of claim 8, the second electrode provides an oxygen reservoir.

10. The non-volatile memory device of claim 8, wherein the transition metal is selected from the group consisting of tungsten (W), vanadium (V), chromium (Cr), and iridium (Ir).

* * * * *